(12) United States Patent
Tanida

(10) Patent No.: US 6,269,044 B1
(45) Date of Patent: Jul. 31, 2001

(54) SEMICONDUCTOR MEMORY DEVICE EMPLOYING AN ABNORMAL CURRENT CONSUMPTION DETECTION SCHEME

(75) Inventor: Susumu Tanida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/606,207

(22) Filed: Jun. 29, 2000

(30) Foreign Application Priority Data

Jul. 9, 1999 (JP) ................................... 11-195990

(51) Int. Cl.[7] ....................................................... G11C 8/00
(52) U.S. Cl. ........................................ 365/230.03; 365/201
(58) Field of Search ................................. 365/201, 230.03

(56) References Cited

U.S. PATENT DOCUMENTS 6,041,002 * 3/2000 Macjima ............................. 365/201

FOREIGN PATENT DOCUMENTS

| 5-6699 | 1/1993 | (JP) . |
| 9-91993 | 4/1997 | (JP) . |

* cited by examiner

*Primary Examiner*—David Nelms
*Assistant Examiner*—M. Tran
(74) *Attorney, Agent, or Firm*—McDermott, Will & Emery

(57) ABSTRACT

The present invention provides a semiconductor memory device which can detect without fail an abnormal operating current caused by a defect of a transistor comprising a sense amplifier circuit provided for each operating block in a short period of time, where in a test mode, carried out to see whether or not the operating current of the semiconductor memory device 1 satisfies the standard, the switching circuit 4 is provided for activating sense amplifier circuits 5*a* to 5*d* in all the operating blocks 2*a* to 2*d* irrelevant of the block selecting signals BS1 to BS4 inputted from the outside at the time of test mode.

8 Claims, 8 Drawing Sheets

SEMICONDUCTOR MEMORY DEVICE EMPLOYING AN ABNORMAL CURRENT CONSUMPTION DETECTION SCHEME

BACKGROUND OF THE INVENTION

1. Field of the Invention

The present invention relates to a semiconductor memory device utilizing semiconductor memories and, more particularly, to the semiconductor memory device having a function for detecting the presence or absence of an abnormal current consumption resulting from defects or the like that are found in transistors forming a sense amplifier.

2. Description of the Prior Art

Conventionally, in a semiconductor memory device comprising a plurality of operating blocks, there are cases where the current consumption changes depending on activated operating blocks because of the uneven characteristics or imperfection of the transistors forming the sense amplifier.

FIG. 7 is a schematic diagram showing a configuration of a semiconductor memory device according to the prior art. In FIG. 7, a semiconductor memory device comprising four operating blocks is shown as an example, and in particular an activation circuit for each sense amplifier circuit of the semiconductor memory device is shown.

In FIG. 7, a semiconductor memory device 100 is provided with a sense amplifier circuit comprising a plurality of sense amplifiers, four operating blocks 101 to 104 comprising row decoders and memory cell blocks, an operating block selecting circuit 105 for selecting and activating operating blocks 101 to 104 based on a block selecting signal from the outside.

The operating block selecting circuit 105 takes a logical product between sense amplifier activation signals SP and SN inputted from the outside and block selecting signals BS1 to BS4 inputted from the outside, and generates internal sense amplifier activation signals ZSP1 to ZSP4 and SN1 to SN4, respectively, for respective sense amplifier circuits in each operating block 101 to 104 to be outputted to the corresponding sense amplifier circuit, respectively. A character "Z" affixed to reference characters ZSP1 to ZSP4 each representing the internal sense amplifier activation signal indicates a negative logic, that is to say, Low active.

As for the block selecting signals BS1 to BS4 inputted from the outside, they are inputted so that at least one of the signals is activated and all of the selecting signals are not activated simultaneously. Therefore, only the sense amplifier circuit of at least one operating block among the operating blocks 101 to 104 is activated and all the sense amplifier circuits are not activated simultaneously. Here, it is assumed that a sense amplifier in the sense amplifier circuit of the operating block 104 among the operating blocks 101 to 104 is defective and an abnormal current flows only when the sense amplifier circuit of the operating block 104 is activated. The abnormal current is a current which is not supposed to flow between the power terminal Vdd and the ground, which has a larger OFF current, a leak current when the transistor is turned off, than normal and which can be detected only when an abnormal sense amplifier circuit is activated.

FIG. 8 is a schematic circuit diagram showing an example of the sense amplifier circuit of the operating block 104. FIG. 8 shows the case where a sense amplifier circuit 111 of the operating block 104 comprises (n+1) sense amplifiers SA0 to SAn. In FIG. 8, in the case that for example N-channel metal oxide semiconductor field effect transistors (hereinafter referred to as NMOS transistors) Qa and Qb are defective and a leak current between the source and the drain when the NMOS transistors Qa and Qb are turned off is larger then normal, the above described abnormal current flows between the power terminal Vdd and the ground.

FIG. 9 is a diagram showing a waveform of each signal when the sense amplifier circuit 111 in FIG. 8 is activated, which shows the case when NMOS transistors Qa and Qb are defective. Here, BL0 and ZBL0 show bit lines connected to the sense amplifier SA0, and "Z" of the bit line ZBL0 indicates that it is Low active and hereinafter reference characters with "Z" attached in the front represents that they are Low active.

As shown in FIG. 9, only when the sense amplifier SA0 having defective NMOS transistors Qa and Qb is activated, that is, only when the sense amplifier circuit 111 of the operating block 104 is activated, the leak current of the semiconductor memory device 100 shows an abnormal value and in the case that other normal operating blocks 101 to 103 are activated, the leak current shows a normal value as exhibited with a broken line. Therefore, in the case that a test is carried out to find whether or not the operating current of the semiconductor memory device 100 satisfies a predetermined standard value, it is necessary to perform a current measurement while switching the operating blocks 101 to 104 because the current consumption differs depending on the operating block, which has a problem that the test time takes too long.

On the other hand, in the case that a defective sense amplifier in the sense amplifier circuit is activated, there is a possibility that the operating current value of the sense amplifier circuit part may change according to a logical condition of the bit line due to a position of the defective transistor of the sense amplifier. For example, in FIG. 8, it is assumed that the NMOS transistor Qa is defective where the OFF current is larger than normal. In this case, when the bit line ZBL0 is at High level and the bit line BL0 is at Low level, an abnormal current flows through the NMOS transistor Qa because it carries out a current pass. However, when the bit line ZBL0 is at Low level and the bit line BL0 is at High level, an abnormal current does not flow because the NMOS transistor Qa is irrelevant of a current pass.

To detect such a defect of the sense amplifier without fail, the operating current may be measured while changing the combinations of the logical conditions of the bit lined BL0 and ZBL0, but at that time they need to have ordinal writing operations.

FIG. 10 is a diagram showing a waveform of each part in FIG. 8 in the ordinal writing operation. Here, WBE in FIG. 10 shows an activation signal inputted from the outside to a writing buffer 112 in FIG. 8.

As shown in FIG. 10, in the ordinal writing operation, the writing operation can be carried to the sense amplifiers one at one time and, therefore, there is a problem that it takes too long to have the writing operations for all sense amplifiers. And because each sense amplifier has a cross couple of two inverters, it is still difficult to perform the writing operations for all sense amplifiers in the sense amplifier circuit part simultaneously due to the lack of the ability of the writing buffer 112 even though column selecting lines CSLO to CSLn are activated simultaneously at the time of writing operations.

In the Japanese Patent Laid-Open Publication No. 5-6699 published on Jan. 14, 1993, it is disclosed that a plurality of sense amplifiers are activated simultaneously in order to shorten the test time of memory elements, and in the Japanese Patent Laid-Open Publication No. 9-91993 published on Apr. 4, 1997, it is disclosed to activate a plurality of word lines simultaneously in order to shorten the test time of writing to memory elements.

SUMMARY OF THE INVENTION

The present invention has been developed to substantially eliminate the above described problems, and has for its object to provide a semiconductor memory device which can detect, in a short time without fail, an abnormal operating current which occurs due to the defect of a transistor forming a sense amplifier circuit provided for each operating block.

A semiconductor memory device according to the present invention is provided with memory cell blocks formed with a memory cell alley, a sense amplifier provided corresponding to each bit line of the memory cell block and a plurality of operating blocks each of which is formed from a variety of decoders or the like. The semiconductor memory device includes an operating block selecting circuit part for controlling the operation of each operating block in accordance with a block selecting signal for selecting an inputted operating block corresponding to a signal from the outside, and a test mode switching circuit part for putting the operating block selecting circuit part into an active condition by selecting all the operating blocks irrelevant of the block selecting signal when a predetermined test mode signal is inputted from the outside.

Therefore, the time needed for the test can be shortened because of the test mode switching circuit part provided and a defect of the sense amplifier in at least one operating block can be detected through one measurement of current.

In a semiconductor memory device according to the present invention, the above described test mode switching circuit part is preferably constructed so that all the sense amplifiers are in an active condition in at least each operating block irrelevant of the block selecting signal for the operating block selecting circuit part when a predetermined test mode signal is inputted from the outside. That is to say, it is desirable to put all the sense amplifier in at least each operating block into an operating condition irrelevant of the block selecting signal. Since no operating current flows in other circuits than the sense amplifier in each operating block when all the sense amplifier in each operating block are only activated, it becomes easy to assume that in the case that an abnormal current is observed, the abnormal current is an abnormal current in the sense amplifier.

A semiconductor memory device according to the present invention may also be provided with a writing circuit part for writing data inputted from the outside for each bit line in each memory cell block. In this case, the test mode switching circuit part makes the writing circuit part write data when the above described predetermined test mode signal is inputted, and, after that, part puts all of the sense amplifiers in each operating block into an active condition irrelevant of the block selecting signal for the operating block selecting circuit.

In this preferable configuration, data can be written into all the sense amplifier without reinforcing the writing circuit part, and therefore the data writing time to all the sense amplifier can be shortened when the defect of the sense amplifier where the operating current value changes depending on the combinations of the logical conditions of a corresponding pair of bit lines is detected, and the time needed for the test can be shortened. In addition, it becomes unnecessary to reinforce the ability of the writing circuit part when the data are written in the plurality of sense amplifiers.

In the semiconductor memory device according to the present invention provided with the writing circuit part as described above, the above described test mode switching circuit part may comprise a writing activation signal generation part for generating and outputting a writing activation signal for the test mode which puts the above described writing circuit part to an active condition at the time of test mode, and a sense amplifier activation signal generation part for generating and outputting a sense amplifier activation signal for the test mode which put all the sense amplifier into an active condition in each operating block for the operating block selecting circuit part at the time of test mode. The sense amplifier activation signal generating part outputs a sense amplifier activation signal after a writing activation signal for the test mode is outputted from the writing activation signal generation part.

A semiconductor memory device according to the present invention is provided as a semiconductor memory device comprising memory cell blocks formed with a memory cell alley, a sense amplifier provided corresponding to each bit line of the memory cell block and a plurality of operating blocks each of which is formed from a variety of decoders or the like, and may comprise, an operating block selecting circuit part for controlling the operation of each operating block in accordance with a block selecting signal for selecting an inputted operating block corresponding to a signal from the outside, a writing circuit part for writing data inputted from the outside to each bit line in each memory cell block and a test mode switching circuit part for making the operating block selecting circuit part put all the sense amplifier in at least 1 operating block selected by the block selecting signal into an active condition after making the writing circuit part write data when a predetermined test mode signal is inputted from the outside. In this configuration, data can be written in all the sense amplifier in the selected operating block without reinforcing a writing circuit part, therefore the data writing time to all the sense amplifier can be shortened when the defect of the sense amplifier where the operating current value changes depending on the combinations of the logical conditions of a corresponding pair of bit lines is detected, and the time necessary for the test can be shortened. In addition, it becomes unnecessary to reinforce the ability of the writing circuit part when data are written in to the plurality of sense amplifiers.

And the above described test mode switching circuit part may comprise a writing activation signal generation part for generating and outputting a writing activation signal for the test mode which puts the above described writing circuit part to an active condition at the time of test mode and a sense amplifier activation signal generation part for generating and outputting a sense amplifier activation signal for the test mode which put all the sense amplifier into an active condition in the operating block selected by the block selecting signal for the operating block selecting circuit part at the time of test mode. In this case, the sense amplifier activation signal generating part outputs a sense amplifier activation signal after a writing activation signal for the test mode is outputted from the writing activation signal generation part.

More concretely, at the time of test mode, the sense amplifier activation signal generation part outputs a sense amplifier activation signal after a writing activation signal for the test mode is outputted from the writing activation signal generation part. Thereby, data can be written into all the sense amplifier in at least one selected operating block without reinforcing the writing circuit part.

The above described writing circuit part may comprise a writing circuit for transferring writing data inputted from the outside to a corresponding I/O line and an I/O gate circuit for controlling respective connections between the I/O line and each bit line corresponding to a column selecting signal inputted in accordance with a signal from the outside, wherein the column selecting signal may be inputted into the I/O gate circuit so that all the bit lines are connected to the I/O line at the time of test mode. More concretely, the writing circuit part is provided with the writing circuit and the I/O gate circuit so that the column selecting signal is inputted into the I/O gate circuit to connect all the bit lines with the corresponding I/O line. Thereby, data can be written into all the sense amplifier without reinforcing the writing circuit.

BRIEF DESCRIPTION OF THE DRAWINGS

The present invention will become readily understood from the following description of preferred embodiments thereof made with reference to the accompanying drawings, in which like parts are designated by like reference numeral and in which.

DESCRIPTION OF THE EMBODIMENT

Embodiment 1

Figure 1:
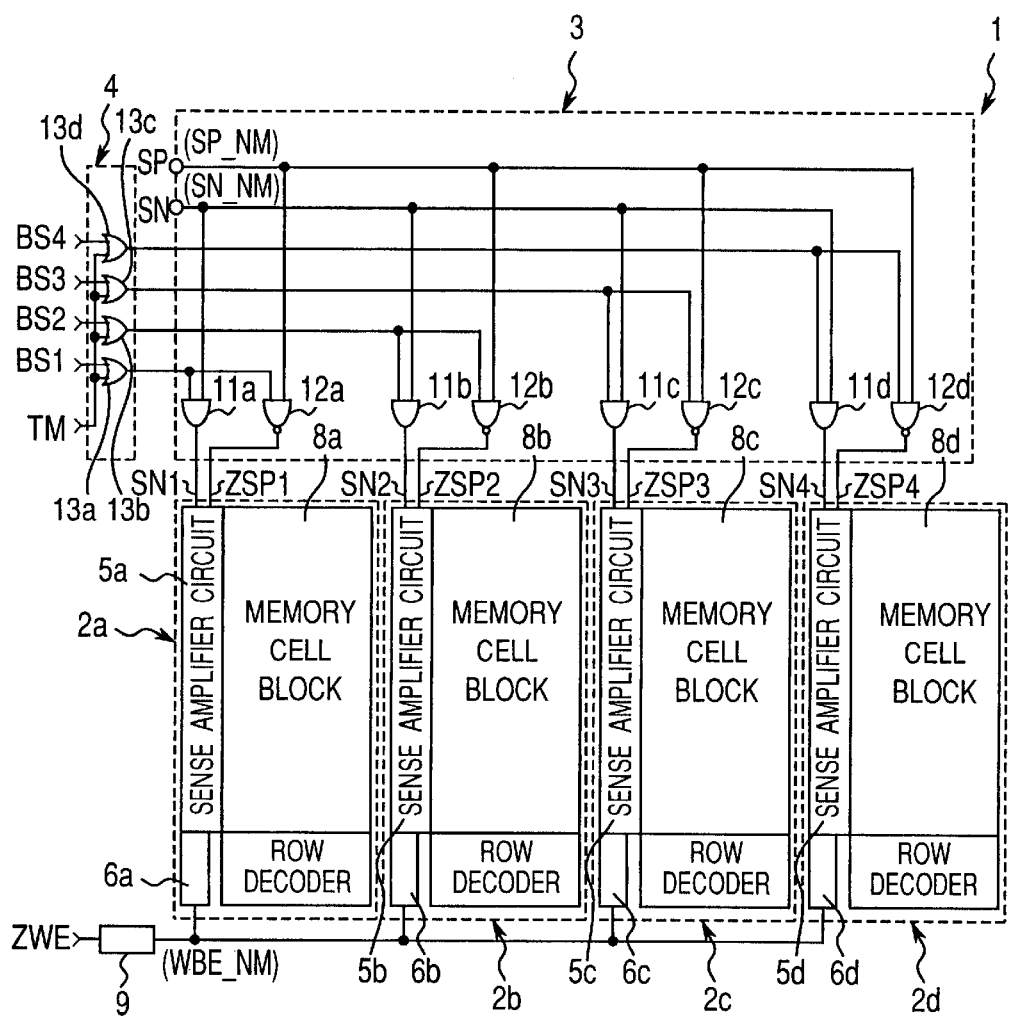
FIG. 1 is a schematic view showing a configuration example of a semiconductor memory device of Embodiment 1 according to the present invention.

FIG. 1 is a schematic view showing a configuration example of a semiconductor memory device in Embodiment 1 according to the present invention. FIG. 1 shows an example of a semiconductor memory device comprising four operating blocks, in particular an activation circuit example for each sense amplifier circuit of the semiconductor memory device.

In FIG. 1, a semiconductor memory device 1 is provided with four operating blocks 2a to 2d, an operating block selecting circuit 3 for selecting and activating the operating blocks 2a to 2d based on block selecting signals BS1 to BS4 from the outside and a test mode switching circuit 4 for controlling the operation of the operating block selecting circuit 3 corresponding to a predetermined test mode signal TM inputted from the outside at the time of test mode.

Each operating block 2a to 2d is provided with a respectively sense amplifier circuit 5a to 5d, writing buffer 6a to 6d, row decoder 7a to 7d, memory cell block 8a to 8d and the like, and each sense amplifier circuit 5a to 5d comprises a plurality of sense amplifiers. In addition, the semiconductor memory device 1 is provided with a writing control circuit 9 for generating and outputting a writing buffer activation signal WBE_NM sent from inputted writing activation signal ZWE to each writing buffer 6a to 6d at the time of normal operation. Here, "Z" in the symbol for the writing activation signal ZWE represents a negative logic that is Low active, and hereinafter symbols with "Z" attached in the front represent being Low active.

The operating block selecting circuit 3 is formed from AND circuits 11a to 11d and NAND circuits 12a to 12d provided corresponding to each operating block 2a to 2d. In each of the AND circuits 11a to 11d, each output is connected to a corresponding sense amplifier circuit 5a to 5d, and into one of the inputs, a sense amplifier activation signal SN_NM is inputted through the input terminal SN of the operating block selecting circuit 3 and the other input is connected to the test mode switching circuit 4. In each of the NAND circuits 12a to 12d, each output is connected to a corresponding sense amplifier circuit 5a to 5d, and into one of the inputs, a sense amplifier activation signal SP_NM is inputted through the input terminal SP of the operating block selecting circuit 3 and the other input is connected to the test mode switching circuit 4.

The test mode switching circuit 4 is formed from NOR circuits 13a to 13d, each output of the NOR circuits 13a to 13d is connected to the other input of each of the corresponding AND circuits 11a to 11d and NAND circuits 12a to 12d in the operating block selecting circuit 3. And in each NOR circuit 13a to 13d, the test mode signal TM is inputted to one of the inputs form the outside and the corresponding block selecting signal BS1 to BS4 is inputted to the other input.

In such a configuration, the test mode switching circuit 4 outputs the inputted block selected signals BS1 to BS4 to one of the inputs of respective AND circuits 11a to 11d and respective NAND circuits 12a to 12d in the operating block selecting circuit 3 at the time of normal operation where the test mode signal TM is at Low level. Each AND circuits 11a to 11d generates an internal sense amplifier activation signal SN1 to SN4 from the corresponding block selecting signal BS1 to BS4 and a sense amplifier activation signal SN_NM to be outputted to the corresponding sense amplifier circuit 5a to 5d. And each NAND circuits 12a to 12d generates an internal sense amplifier activation signal ZSP1 to ZSP4 from the corresponding block selecting signal BS1 to BS4 and a sense amplifier activation signal SP_NM to be outputted to the corresponding sense amplifier circuit 5a to 5d.

Figure 2:
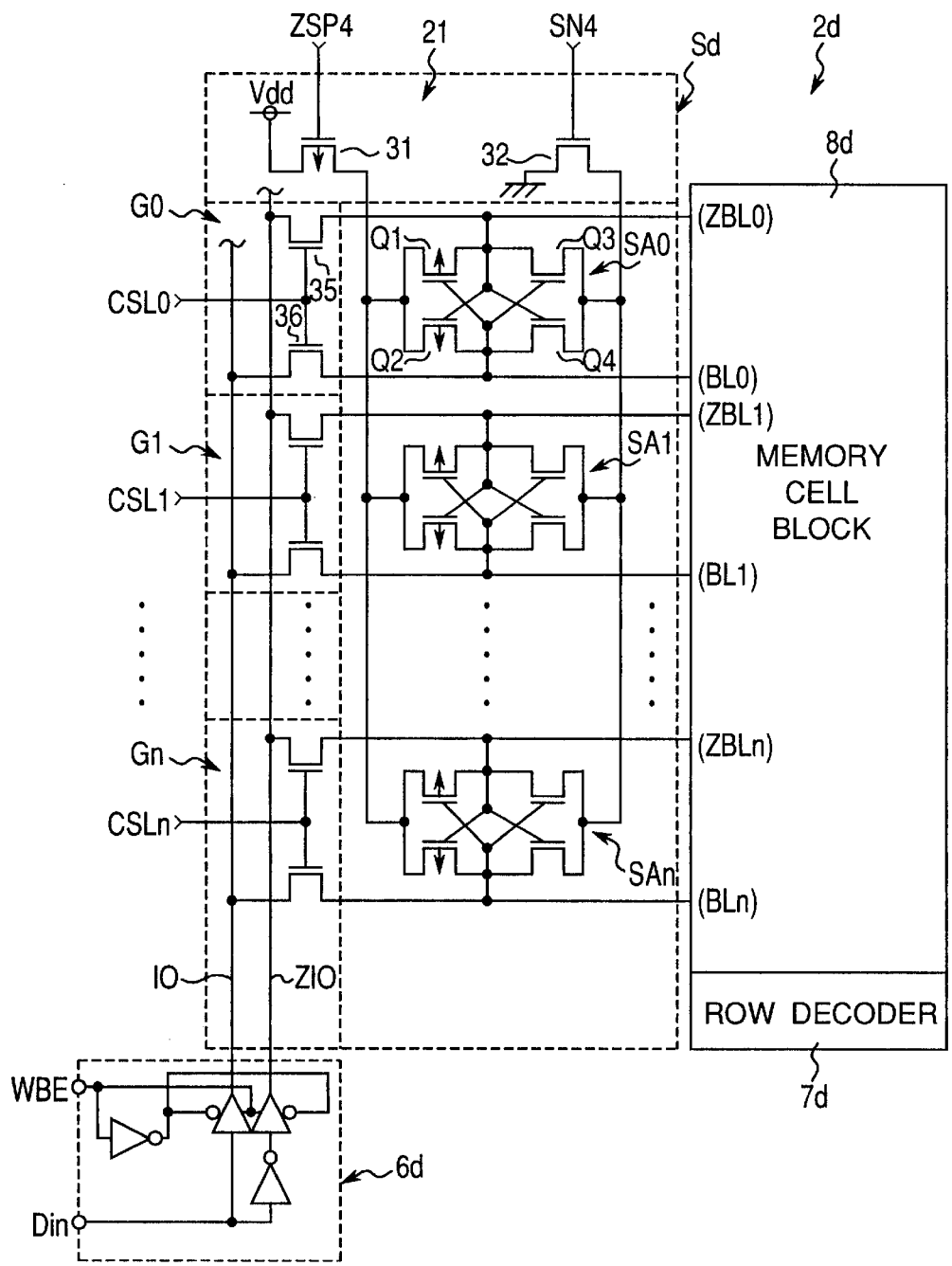
FIG. 2 is a schematic circuit diagram showing an example of a sense amplifier circuit in each operating block shown in FIG. 1.

FIG. 2 is a schematic circuit diagram showing an example of a sense amplifier circuit in each operating block shown in FIG. 1, which shows the operating block 2d in FIG. 1 as an example. FIG. 2 shows as an example the case where the sense amplifier circuit 5d of the operating block 2d comprises (n+1) sense amplifiers. And each sense amplifier circuit in the operating block 2a to 2c is the same as in the operating block 2d, of which the description is omitted.

In FIG. 2, the sense amplifier circuit 5d comprises (n+1) sense amplifier SA0 to SAn, I/O gate circuits G0 to Gn provided corresponding to each of the sense amplifiers SA0 to SAn and a sense amplifier driving circuit 21 for driving and controlling the sense amplifiers SA0 to SAn. To the sense amplifiers SA0 to San, corresponding I/O gate circuits G0 to Gn and corresponding bit lines BL0 to BLn and ZBL0 to ZBLn are connected respectively and in addition the sense amplifier driving circuit 21 is also connected.

And to I/O gate circuits G0 to Gn, corresponding column selecting signals CSL0 to CSLn are inputted respectively and the writing buffer 6d is connected via a pair of I/O lines IO and ZIO. The writing buffer 6d outputs writing data inputted to the data input terminal Din from the outside to the I/O lines IO and ZIO at the time of writing operation according to the writing buffer activation signal WBE_NM inputted from the writing control circuit 9. Since the sense amplifier SA0 to SAn have the same circuit configuration, the sense amplifier SA0 is described as an example in the following, and the sense amplifiers SA1 to SAn are omitted in the description.

The sense amplifier SA0 comprises P-channel metal oxide semiconductor field-effect transistors (hereinafter referred to as PMOS transistors) Q1 and Q2 and N-channel metal oxide semiconductor field-effect transistors (hereinafter referred to as NMOS transistors) Q3 and Q4. The PMOS transistor Q1 and the NMOS transistor Q3 as well as the PMOS transistor Q2 and the NMOS transistor Q4 form inverter circuits, respectively and the two inverter circuits form a cross couple. The sense amplifier driving circuit 21 comprises a PMOS transistor 31 of which source is connected to the power terminal Vdd and an NMOS transistor 32 of which source is connected to the ground, and the I/O gate circuit G0 comprises to NMOS transistors 35 and 36.

Each of the drains of the PMOS transistor Q1 and the NMOS transistor Q3 is connected to each other, a junction therebetween being connected to the bit line ZBL0 and to the connection of each gate of the PMOS transistor Q2 and the NMOS transistor Q4. In the same way, each drain of the PMOS transistor Q2 and the NMOS transistor Q4 is connected to each other, a junction therebetween being connected to the bit line BL0 and to the connection of each gate of the PMOS transistor Q1 and the NMOS transistor Q3.

Each source of the NMOS transistors Q1 and Q2 is connected to each other, a junction therebetween being connected to the drain of the NMOS transistor 31 in the sense amplifier driving circuit 21 and each source of the NMOS transistors Q3 and Q4 is connected to each other, a junction therebetween being connected to the drain of the NMOS transistor 32 in the sense amplifier driving circuit 21. And an internal sense amplifier activation signal ZSP4 is inputted into the gate of the PMOS transistor 31 and an internal sense amplifier activation signal SN4 is inputted into the gate of the NMOS transistor 32, respectively.

On the other hand, in the I/O gate circuit G0, the drain and the source of the NMOS transistor 35 are connected between the I/O line ZIO and the bit line ZBL0, and the drain and the source of the NMOS transistor 36 are connected between the I/O line IO and the bit line BL0. And to the connection of each gate of the NMOS transistors 35 and 36, a corresponding column selecting signal CSL0 is inputted.

In such a configuration, when a test mode signal TM of Low level is inputted to the test mode switching circuit 4, each output of the NOR circuits 13a to 13d of the test mode switching circuit 4 becomes the level corresponding to the block selecting signal BS1 to BS4 inputted in such a manner either one of the sense amplifier circuits of the operating block 2a to 2d is activated.

On the contrary, when the test mode signal TM of High level is inputted to the test mode switching circuit 4, each output of the NOR circuits 13a to 13d becomes High level respectively irrelevant of the block selecting signals BS1 to BS4, and it becomes the condition where block selecting signals are inputted into the operating block selecting circuit 3 so that each operating block 2a to 2b is all selected. In such a condition, when sense amplifier activation signals SP_NM and SN_NM of High level are inputted, all the internal sense amplifier activation signals SN1 to SN4 become High level and all the internal sense amplifier activation signals ZSP1 to ZSP4 become Low level. Thereby each of the sense amplifier circuits 5a to 5d all becomes in an active condition.

Figure 3:
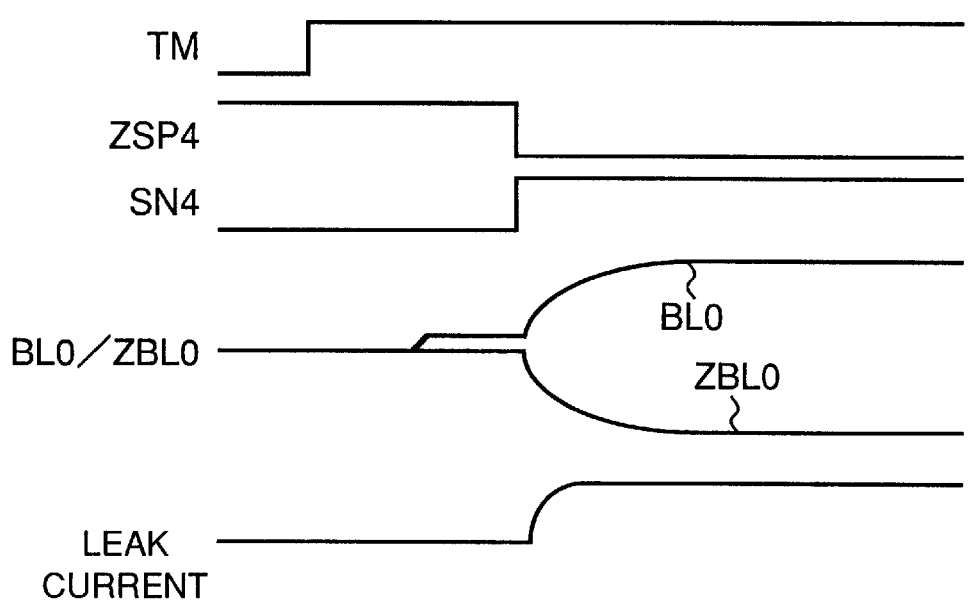
FIG. 3 is a diagram showing a waveform of each part at the time of test mode of a semiconductor memory device 1 shown in FIGS. 1 and 2.

Here, for example, the sense amplifier circuit 5d of the operating block 2d is assumed to be defective, and an abnormal current is assumed to flow only when the sense amplifier circuit 5d is activated. FIG. 3 is a diagram showing a waveform of each signal at the time of test mode in such a condition. As can be seen in FIG. 3, at the time of test mode where the test is carried out to find whether or not the operating current of the semiconductor memory device 1 satisfies the standard, the leak current always exhibits an abnormal value in the case that either one of the sense amplifier circuits 5a to 5d is defective since all the sense amplifier circuits 5a to 5d are activated.

At the time of the above described test mode, row decoders 7a to 7d and memory cell blocks 8a to 8d or the like other than the sense amplifier circuits 5a to 5d may be activated. Particularly when only the sense amplifier circuits 5a to 5d are activated, since the operating current does not flow through the row decoders 7a to 7d and the memory cell blocks 8a to 8d it becomes easy to assume the abnormal current as an abnormal current in the sense amplifier circuits 5a to 5d when an abnormal current is observed.

In this way, the semiconductor memory device of the present embodiment 1 is provided with the test mode switching circuit 4 which activates the sense amplifier circuits 5a to 5d in all the operating blocks 2a to 2d irrelevant of the block selecting signals BS1 to BS4 inputted from the outside at the time of test mode when the test is carried out to see whether or not the operating current of the semiconductor memory device 1 satisfies the standard. Thereby, a defect of a sense amplifier circuit in at least one operating block can be detected through one measurement of current, so that the time necessary for the test can be shortened.

Embodiment 2

In the above described Embodiment 1, in the case that a particular MOS transistor comprising one sense amplifier in a sense amplifier circuit is defected, sometimes an abnormal current does not flow depending on a signal level of the bit line and the defect of the sense amplifier can not be detected. Therefore in order to detect the defect of the sense amplifier without fail, the writing operation may be performed simultaneously for all the pairs of bit lines in the operating block and an operating current may be measured while changing the combinations of the logical conditions. Such the configuration is shown as Embodiment 2 according to the present invention.

Figure 4:
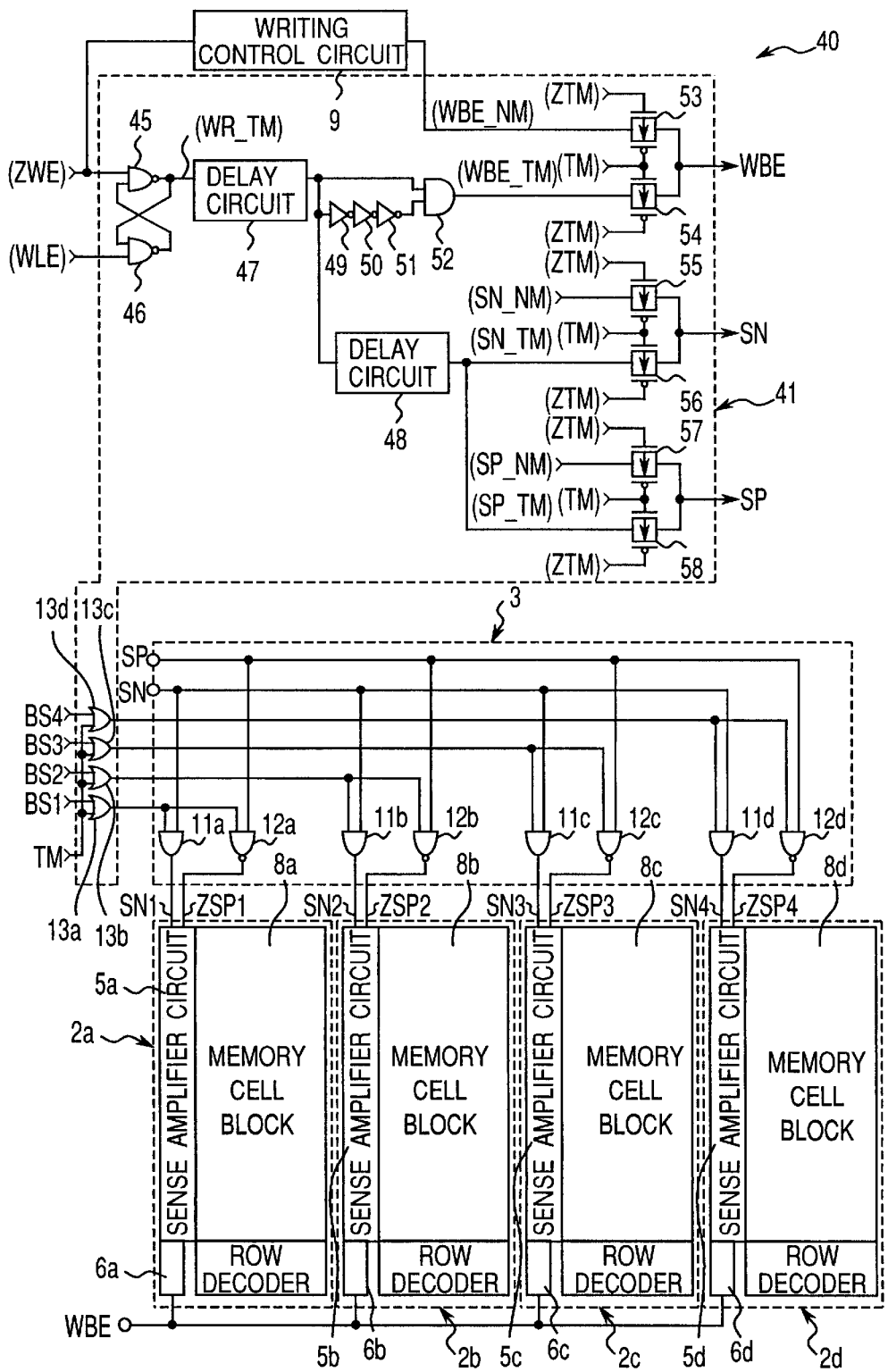
FIG. 4 is a schematic view showing a configuration example of a semiconductor, memory device of Embodiment 2 according to the present invention.

FIG. 4 is a schematic view showing a configuration example of a semiconductor memory device of Embodiment 2 according to the present invention. In FIG. 4, a semiconductor memory device comprising four operating blocks is also shown as an example, in particular an activation circuit example is shown for each sense amplifier circuit of the semiconductor memory device. In FIG. 4, the same symbols represent the same as in FIG. 1, of which the descriptions are omitted here and only the different point with the FIG. 1 are described.

The different point of FIG. 4 from FIG. 1 is that the circuit configuration of the test mode switching circuit 4 in FIG. 1 is changed so that when a predetermined test mode signal TM is inputted, sense amplifier activation signals SN_TN and SP_TN for the test mode are generated to be outputted to the operating block selecting circuit 3 and a writing buffer activation signal WBE_TM for the test mode is generated to be outputted to the writing buffers 6a to 6d. Based on this, the test mode switching circuit 4 in FIG. 1 is denoted as a test mode switching circuit 41 and the semiconductor memory device 1 in FIG. 1 is denoted as a semiconductor memory device 40.

In FIG. 4, the semiconductor memory device 40 is provided with operating blocks 2a to 2d, an operating block selecting circuit 3, a writing control circuit 9 and a test mode switching circuit 41 for controlling the operation of the operating block selecting circuit 3 in accordance with a predetermined test mode signal TM inputted from the outside at the time of test mode. The test mode switching circuit 41 is formed from NOR circuits 13a to 13d, NAND circuits 45 and 46, delay circuits 47 and 48, three inverter circuits 49 to 51, an AND circuit 52 and transmission gates 53 to 58.

The NAND circuits 45 and 46 form an RS flip-flop, and the output of the NAND circuit 45 which is the output of the RS flip-flop is connected to the delay circuit 47. In addition, into one of the input terminals of the NAND circuit 45 which is one of the input terminals of the RS flip-flop, the writing activation signal ZWE is inputted, and into one of the input terminals of the NAND circuit 46 which is the other input terminal of the RS flip-flop, the word line activation signal WLE which is a signal for activating the word line WL is inputted, respectively. The above described RS flip-flop generates a writing signal WR_TM exclusive for the test mode from the inputted writing activation signal ZWE and word line activation signal WLE to be outputted to the delay circuit 47.

The inverter circuits 49 to 51 are serially connected in the forward direction so that to the input of the serial circuit, to the input of the delay circuit 48 and to one of the inputs of the AND circuit 52, the writing signal WR_TM exclusive for the test mode delayed by the delay circuit 47 is respectively inputted. And the output of the serial circuit of the inverter circuits 49 to 51 is connected to the other input of the AND circuit 52. The output of the AND circuit 52 is connected to the activation signal input terminal WBE of respective writing buffers 6a to 6d of each operating block 2a to 2d via the transmission gate 54 so as to output the writing buffer activation signal WBE_TM at the time of test mode.

The output of the delay circuit 48 is connected to the input terminal SN of the operating block selecting circuit 3 via the transmission gate 56 and is connected to the input terminal SP of the operating block selected circuit 3 via the transmission gate 58. And at the time of normal operation, the test mode switching circuit 41 outputs the inputted writing buffer activation signal WBE_NM at the time of normal operation to the activation signal input terminal WBE in the writing buffers 6a to 6d via the transmission gate 53, respectively, and outputs the inputted sense amplifier activation signals SN_NM and SP_NM at the time of normal operation to the corresponding input terminals SN and SP of the operating block selecting circuit 3 via the corresponding transmission gates 55 and 57.

Into the gate of each PMOS transistor of the transmission gates 53, 55 and 57 as well as into the gate of each NMOS transistor of the transmission gates 54, 56 and 58 a test mode signal TM is inputted, respectively. And into the gate of each NMOS transistor of the transmission gates 53, 55 and 57 as well as into the gate of each PMOS transistor of the transmission gates 54, 56 and 58, a test mode signal ZTM generated by inverting the signal level of a test mode signal TM by, for example, an inverter circuit is inputted, respectively.

Figure 5:
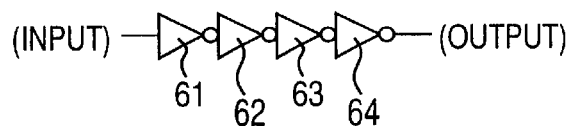
FIG. 5 is a diagram showing a circuit example of delay circuits 47 and 48 in FIG. 4.

FIG. 5 is a diagram showing a circuit example of the delay circuits 47 and 48, and in FIG. 5, a serial circuit is formed by connecting four inverter circuits 61 to 64 in serial in the forward direction. Here, the circuit shown in FIG. 5 represents an example, and sets the number of inverter circuits connected in serial in accordance with the desired delay time of the delay circuits 47 and 48. A schematic circuit diagram showing an example of the sense amplifier circuit in each operating block shown in FIG. 4 is the same as in FIG. 2, which is omitted.

In such a configuration, a test mode signal TM of Low level is inputted into the test mode switching circuit 41 in the normal operational mode, and each outputs of the NOR circuit 13a to 13d of the test mode switching circuit 41 becomes a level corresponding to the block selecting signal BS1 to BS4 outputted from the outside so as to activate either one of the sense amplifier circuits of the operating blocks 2a to 2d.

In addition, since the transmission gates 53, 55 and 57 become in the conducted condition while the transmission gates 54, 56 and 58 become in the non-conducted condition, into the input terminal SN of the operating block selecting circuit 3, the sense amplifier activation signal SN_NM at the time of normal operation is inputted and into the input terminal SP, the sense amplifier activation signal $SP_{13}$ NM at the time of normal operation is inputted, respectively. In addition, into the activation signal input terminal WBE of the respective writing buffers 6a to 6d, the writing buffer activation signal WBE_NM at the time of normal operation is respectively inputted. In this way, the semiconductor memory device 40 operates in the normal operation mode.

On the contrary, when a test mode signal TM of High level is inputted to the test mode switching circuit 41, each outputs of the NOR circuit 13a to 13d becomes High level irrelevant of the block selecting signals BS1 to BS4, so that it becomes a condition where the block selecting signal is inputted to the operating block selecting circuit 3 so as to select all the operating blocks 2a to 2d.

In addition, the transmission gates 53, 55 and 57 become in the conducted condition while the transmission gates 54, 56 and 58 become in the non-conducted condition, into the input terminal SN of the operating block selecting circuit 3, the sense amplifier activation signal SN_TM for the test mode is inputted and into the input terminal SP, the sense amplifier activation signal SP_TM for the test mode is inputted, respectively. In addition, into the activation signal input terminal WBE of the respective writing buffers 6a to 6d, the writing buffer activation signal WBE_TM for the test mode is respectively inputted.

Figure 6:
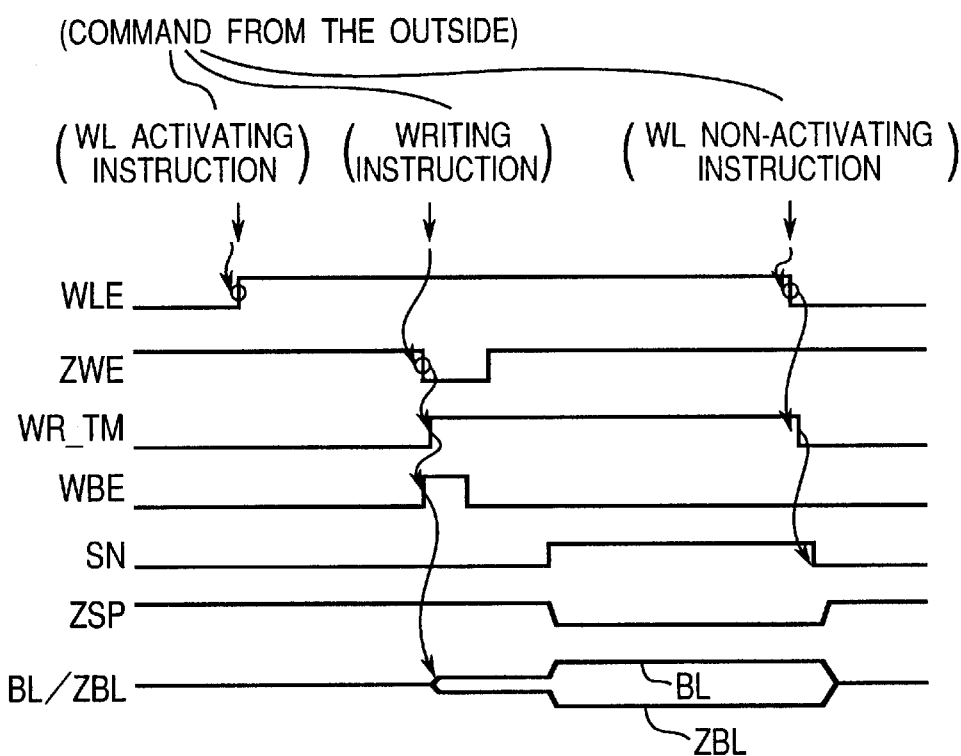
FIG. 6 is a diagram showing a waveform of each part at the time of test mode of a semiconductor memory device 40 shown in FIGS. 4 and 5.
Figure 7:
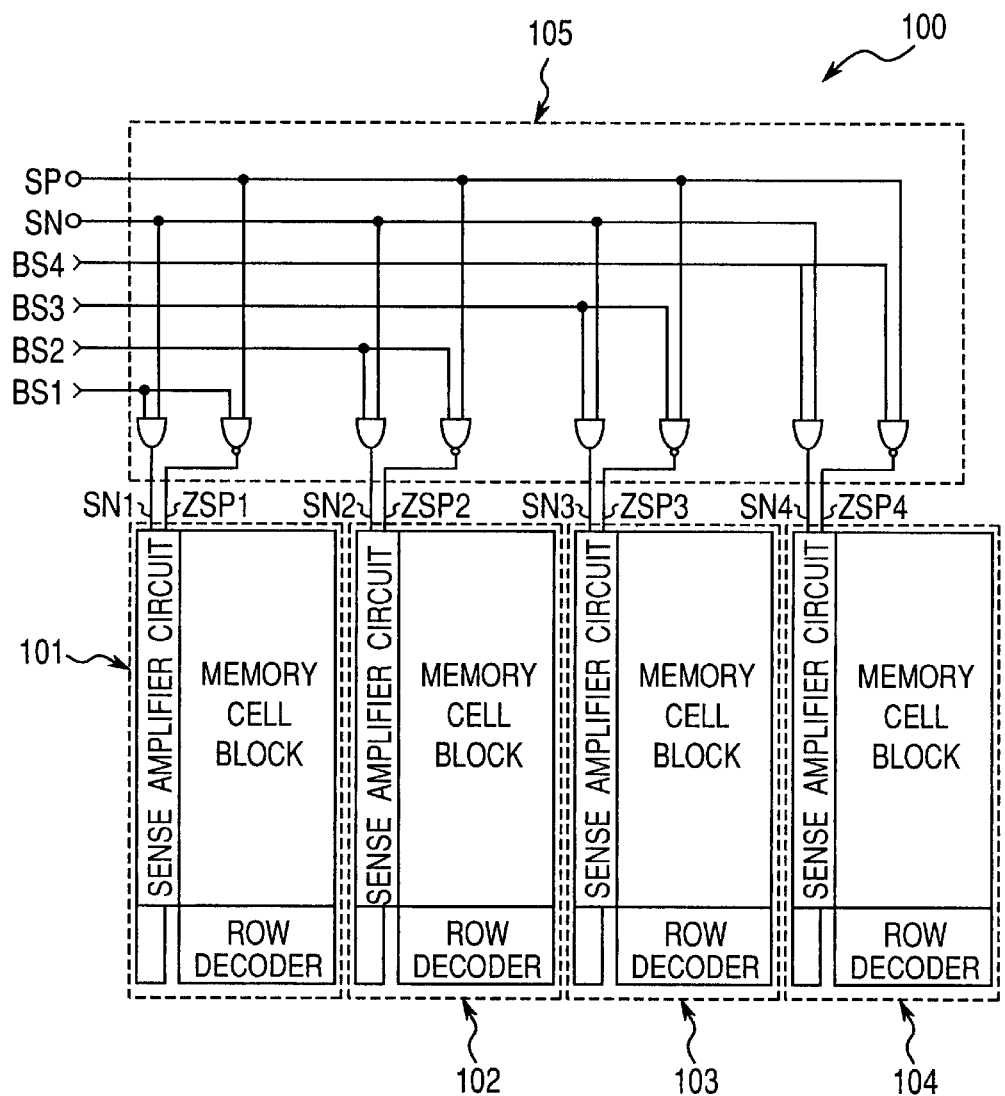
FIG. 7 is a schematic view showing a configuration example of a semiconductor memory device according to a prior art.
Figure 8:
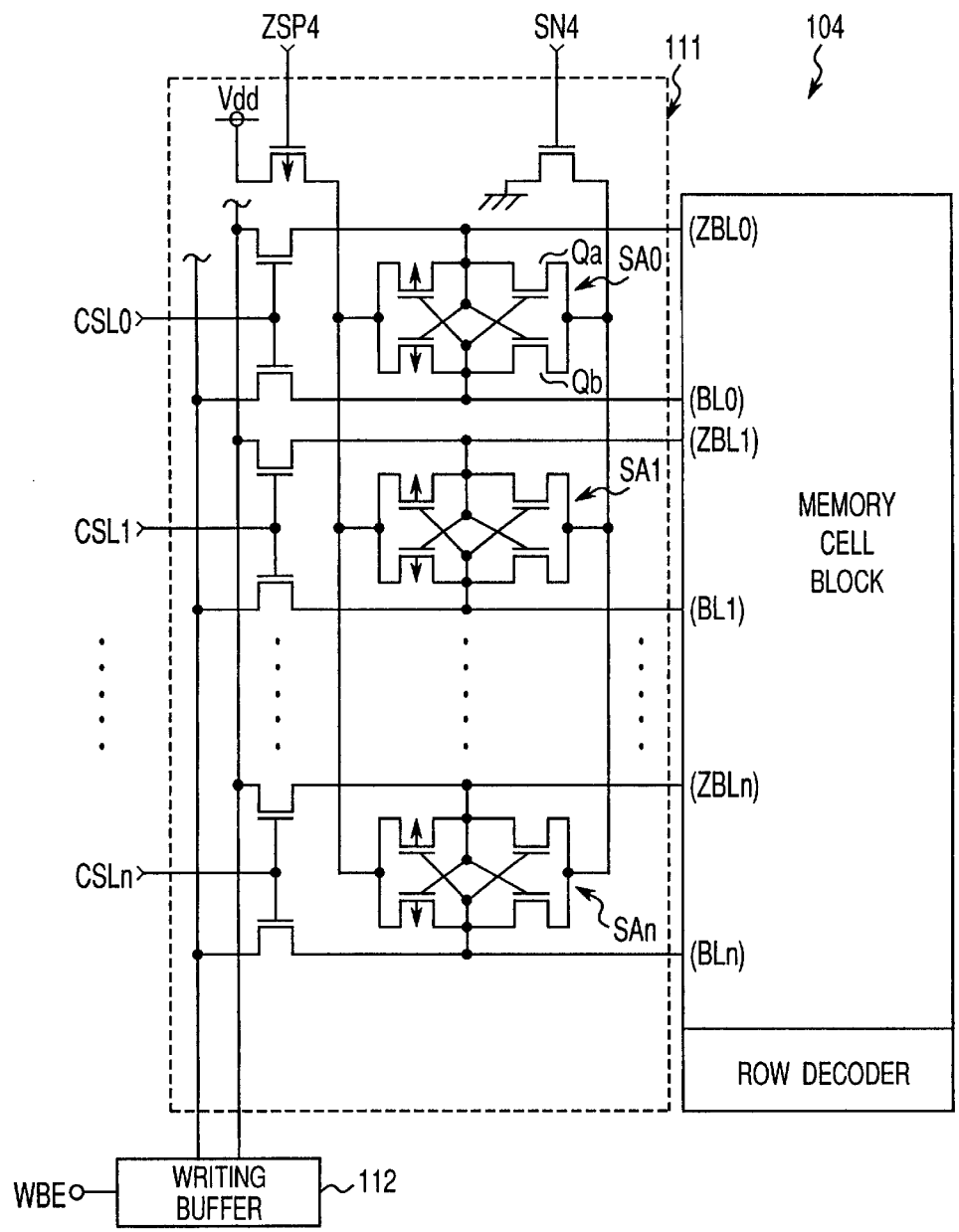
FIG. 8 is a schematic circuit diagram showing an example of the sense amplifier circuit of the operating block 104 in FIG. 7.
Figure 9:
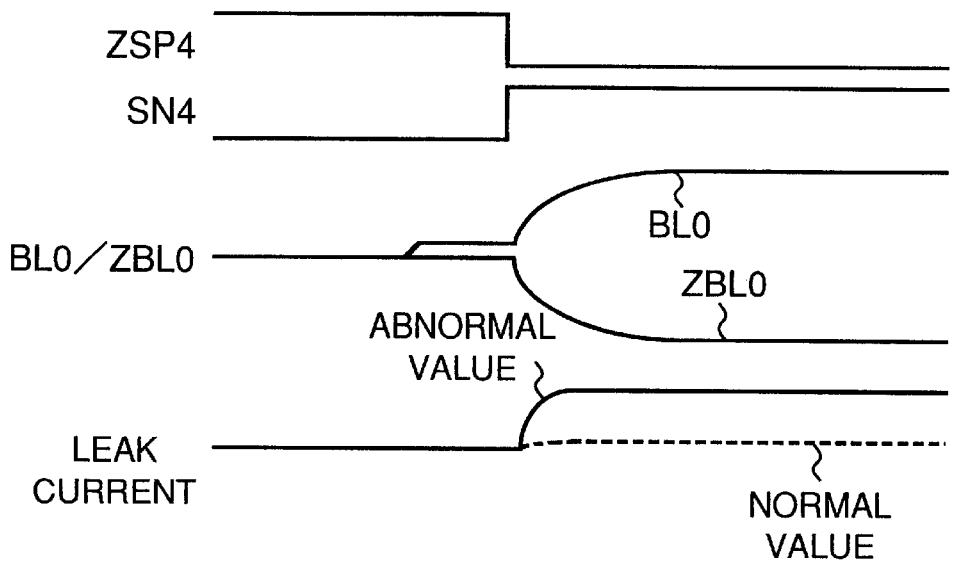
FIG. 9 is diagram showing a waveform of each part when the sense amplifier circuit 111 is activated in FIG. 8.
Figure 10:
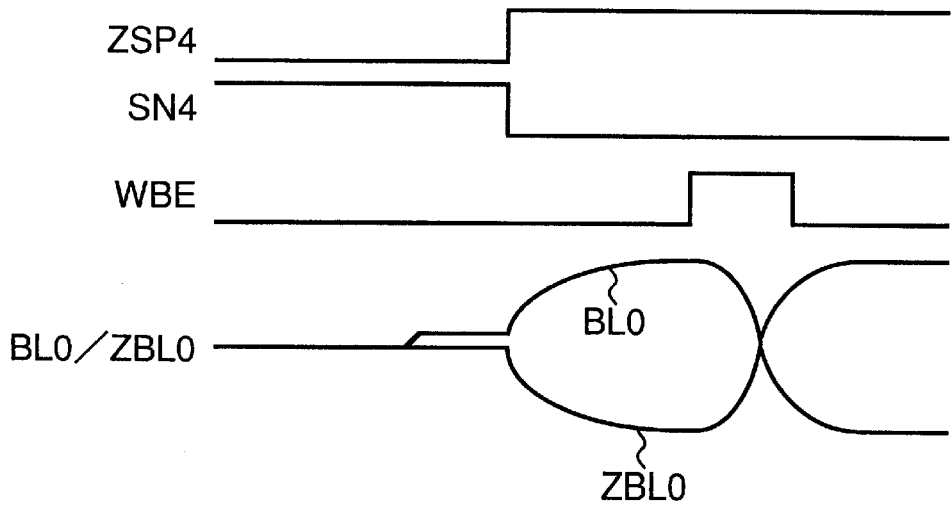
FIG. 10 is a diagram showing a waveform of each part in FIG. 8 at the time of normal writing operation.

FIG. 6 is a diagram showing a waveform of each part of the semiconductor memory device 40 at the time of test mode as shown in FIGS. 4 and 5. In FIG. 6, waveforms of SN and SP are shown as waveforms of an arbitrary pair of internal sense amplifier activation signals in the operating block selecting circuit 3, and waveforms of the pair of bit lines BL and ZBL shows waveforms of an arbitrary pair of bit lines in the operating block 2a to 2d.

As can be seen in FIG. 6, when a command is inputted for activating the word line WL from the outside, the word line activation signal WLE inputted to one of the inputs of the NAND circuit 46 rises from Low level to High level. Under this condition, the command for instructing in further writing is inputted so as to output a write signal WR_TM for exclusively the test mode of High level to the delay circuit 47 from the output of the NAND circuit 45 when a pulse signal of Low level is inputted as a writing activation signal ZWE into one of the inputs of the NAND circuit 45.

The write signal WR_TM for exclusively the test mode outputted from the output of the NAND circuit 45 is delayed by the delay circuit 47 and is used to generate a writing buffer activation signal WBE_TM for the test mode which is a pulse signal of High level, which is then outputted to each activation signal input terminal WBE of the writing buffers 6a to 6d. And the write signal WR_TM exclusively for the test mode which has been delayed by the delay circuit 47 is further delayed by the delay circuit 48, and after that, is outputted as sense amplifier activation signals SN_TM and SP_TM for the test mode, corresponding to the input terminals SN and SP of the operating block selecting circuit 3, respectively.

Thereby, while a pulse signal of High level is inputted into each of the activation signal input terminals WBE, sense amplifier activation signals SN_TM and SP_TM for the test mode of High level are not inputted in each of the input terminals SN and SP of the operating block selecting circuit 3, both of which are found to be of Low level. Thereby, sense amplifier activation signals SN_TM and SP_TM for the test mode of High level are inputted to each of the input terminals SN and SP of the operating block selecting circuit 3 and data are written in to all the bit lined by each writing buffer 6a to 6d before each sense amplifier circuits 5a to 5d becomes an active condition.

At this time, all the column selecting signals are in an active condition and all the corresponding bit lines are connected to each I/O line IO and ZIO by all the I/O gate circuits in each sense amplifier circuit 5a to 5d, and data are written in to all the bit lines in each operating block 2a to 2d by each writing buffer 6a to 6d. By operating in this way, data can be written into all the bit lines in each operating block 2a to 2d under the condition where the operation of all the sense amplifier is halted in each sense amplifier circuit 5a to 5d at the time of test mode, that is to say under the condition where all the sense amplifiers are not in cross couple.

Though, in FIG. 4, a signal outputted from the delay circuit 48 is inputted to the input terminal SP of the operating block selecting circuit 3 via the transmission gate 58, a further delay circuit may be provided between the delay circuit 48 and the transmission gate 58. By doing this, a highly sensitive sensing operation can be performed, though the read-out speed may be reduced.

In this way, the semiconductor memory device of the present embodiment 2 is provided with a test mode switching circuit 41 for activating the sense amplifier circuits 5a to 5d in all the operating blocks 2a to 2d irrelevant of the block selecting signals BS1 to BS4 inputted from the outside at the time of test mode where the test is carried out to see if the operating current of the semiconductor memory device 40 satisfies the standard. In addition, the test mode switching circuit 41 halts the operation of all the sense amplifier driving circuit 21 within each sense amplifier circuits 5a to 5d at the time of test mode and outputs a writing buffer activation signal WBE_TM for the test mode so that each writing buffers 6a to 6d performs the writing operation.

Thereby, the same effects of Embodiment 1 can be gained and data can be written into all the sense amplifier without reinforcing the writing buffers 6a to 6d. Therefore, when a defective sense amplifier is activated data writing time to all the sense amplifier can be shortened when a defect which changes the operating current value depending on the combinations of the logical conditions of corresponding pair of bit lines due to the position of the defective transistor in the sense amplifier is detected, which can shorten the time necessary for the test. In addition, when data are written into a plurality of sense amplifiers, it becomes unnecessary to reinforce the ability of the writing buffer.

Though, in the description of the above described embodiment 2 all the operating blocks are activated at the time of test mode, in the test mode switching circuit 41 of FIG. 4, the NOR circuits 13a to 13d may be omitted and the block selecting signals BS1 to BS4 may be connected to one of the inputs of each of the corresponding AND circuits 11a to 11d and NAND circuits 12a to 12d. In this case, at the time of test mode, all the operating block can not be activated by the block selecting signals BS1 to BS4 inputted from the outside, at least one operating block can, however, be activated so that data may be written into all pairs of bit lines in the activated operating blocks before the sense amplifier circuit is activated as described above so that the operating current may be measured while changing the combinations of the logical conditions.

Though, by doing this, all the operating blocks can not be activated simultaneously, at least one operating block can be activated simultaneously so that the writing time for detecting a defect of the sense amplifier circuit in the operating block can be shortened at the time of test mode to test whether or not the operating current of the semiconductor memory device satisfies the standard, so that the time necessary for the test can be shortened.

In addition, data can be written in all the sense amplifiers without reinforcing the writing buffers 6a to 6d. Thereby, when a defective sense amplifier is activated the data writing time to all the sense amplifiers can be shortened when a defect which changes the operating current value depending on the combinations of the logical conditions of corresponding pair of bit lines due to the position of the defective transistor in the sense amplifier is detected, which can shorten the time necessary for the test compared to that of a prior art. In addition, when data are written into a plurality of sense amplifiers, it becomes unnecessary to reinforce the ability of the writing buffers.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor memory device comprising:

a memory cell block formed with a memory cell array;

a plurality of sense amplifiers, each provided corresponding respectively to each bit line of the memory cell block;

a plurality of operating blocks, each formed with a variety of decoders;

an operating block selecting circuit part for selecting and activating one of said plurality of operating blocks in response to a block selecting signal externally applied thereto in a normal mode, said block selecting signal designating the one of said plurality of operating blocks to be selected; and a test mode switching circuit part for enabling said operating block selection circuit part to activate all of said plurality of operating blocks in response to a predetermined test mode signal externally applied thereto, regardless of which operating block is designated by said block selecting signal.

2. A semiconductor memory device according to claim 1 characterized in that said test mode switching circuit part puts all the sense amplifiers into an active condition in at least each operating block irrelevant of the block selecting signal for said operating block selecting circuit part when a predetermined test mode signal is inputted externally.

3. A semiconductor memory device according to claim 1 characterized in that a writing circuit part for writing data inputted from outside is provided with each of the bit lines in each of said memory cell blocks and said test mode switching circuit part directs the writing circuit part to write data when said predetermined test mode signal is inputted and, after that, puts all the sense amplifiers in each operating block in an active condition irrelevant of the block selecting signal for said operating block selecting circuit part.

4. A semiconductor memory device according to claim 3 characterized by said test mode switching circuit part comprising:
   a writing activation signal generation part for generating and outputting a writing activation signal for a test mode which puts said writing circuit part into an active condition at a time of test mode; and
   a sense amplifier activation signal generation part for generating and outputting a sense amplifier activation signal for a test mode which puts all the sense amplifiers into an active condition in each operating block for said operating block selecting circuit part at a time of test mode,
   wherein the sense amplifier activation signal generation part outputs said sense amplifier activation signal after a writing activation signal for a test mode is outputted from said writing activation signal generation part.

5. A semiconductor memory device according to claim 3 characterized by said writing circuit part comprising:
   a writing circuit for transferring writing data inputted from outside to a corresponding I/O line; and
   an I/O gate circuit for controlling respective of connections between the I/O line and each bit line corresponding to a column selecting signal externally applied thereto,
   wherein said column selecting signal is inputted into said I/O gate circuit so that all the bit lines are connected to said I/O line at a time of test mode.

6. A semiconductor memory device comprising:
   a memory cell block formed with a memory cell array;
   a plurality of sense amplifiers, each provided corresponding respectively to each bit line of the memory cell block;
   a plurality of operating blocks, each formed with a variety of decoders;
   an operating block selecting circuit part for selecting and activating one of said plurality of operating blocks in response to a block selecting signal externally applied thereto in a normal mode, said block selecting signal designating the one of said plurality of operating blocks to be selected;
   a writing circuit part for writing data externally applied thereto to each of the bit lines in each of said memory cell blocks; and
   a test mode switching circuit part for enabling the writing circuit part to write data in response to a predetermined test mode signal externally applied thereto, and then activating all of the sense amplifier in at least one operating block selected by the block selecting signal for said operating block selecting circuit part.

7. A semiconductor memory device according to claim 6 characterized by said test mode switching circuit part comprising:
   a writing activation signal generation part for generating and outputting a writing activation signal for a test mode which puts said writing circuit part into an active condition at a time of test mode; and
   a sense amplifier activation signal generation part for generating and outputting a sense amplifier activation signal for a test mode which puts all the sense amplifiers into an active condition in an operating block selected by the block selecting signal for said operating block selecting circuit part at a time of test mode,
   wherein the sense amplifier activation signal generation part outputs said sense amplifier activation signal after a writing activation signal for a test mode is outputted from said writing activation signal generation part.

8. A semiconductor memory device according to claim 6 characterized by said writing circuit part comprising:
   a writing circuit for transferring writing data inputted from outside to a corresponding I/O line; and
   an I/O gate circuit for controlling each of connections between the I/O line and each bit line corresponding to a column selecting signal externally applied thereto,
   wherein said column selecting signal is inputted into said I/O gate circuit so that all the bit lines are connected to said I/O line at a time of test mode.

\* \* \* \* \*